United States Patent
Tanaka

(10) Patent No.: US 8,302,055 B2
(45) Date of Patent: Oct. 30, 2012

(54) SEMICONDUCTOR DEVICE DESIGN SUPPORT APPARATUS AND SEMICONDUCTOR DEVICE DESIGN SUPPORT METHOD

(75) Inventor: Mikiko Tanaka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 237 days.

(21) Appl. No.: 12/385,879

(22) Filed: Apr. 22, 2009

(65) Prior Publication Data

US 2009/0282378 A1     Nov. 12, 2009

(30) Foreign Application Priority Data

May 12, 2008  (JP) ................ 2008-124730

(51) Int. Cl.
*G06F 17/50* (2006.01)
(52) U.S. Cl. ........... 716/115; 716/111
(58) Field of Classification Search ......... 716/115, 716/111
See application file for complete search history.

(56) References Cited

U.S. PATENT DOCUMENTS

| | | | |
|---|---|---|---|
| 5,872,952 A * | 2/1999 | Tuan et al. ............. 714/724 |
| 7,246,335 B2 | 7/2007 | Murgai et al. |
| 2004/0187085 A1* | 9/2004 | Sinha et al. ............. 716/4 |
| 2005/0005254 A1 | 1/2005 | Hirano et al. |
| 2006/0048081 A1* | 3/2006 | Kiel et al. ............. 716/4 |
| 2006/0184904 A1 | 8/2006 | Murgai et al. |
| 2007/0067747 A1* | 3/2007 | Checka et al. ............. 716/5 |
| 2009/0007032 A1* | 1/2009 | Kariat et al. ............. 716/4 |

FOREIGN PATENT DOCUMENTS

| | | |
|---|---|---|
| JP | 2001-237412 A | 8/2001 |
| JP | 2003-271695 A | 9/2003 |
| JP | 2005-4245 | 1/2005 |
| JP | 2006-236340 | 9/2006 |

OTHER PUBLICATIONS

Singh, Jaskirat; Sapatnekar, Sachin; "Partition-Based Algorithm for Power Grid Design Using Locality," Mar. 27, 2006, IEEE.*
"High-Level Simulation of Substrate Noise Generation Including Power Supply Noise Coupling" Marc van Heijningen, et al. 2000 DAC, pp. 1-6.
Japanese Office Action dated Jun. 26, 2012 (Partial English Translation).

* cited by examiner

*Primary Examiner* — Vuthe Siek
*Assistant Examiner* — Eric Lee
(74) *Attorney, Agent, or Firm* — McGinn IP Law Group, PLLC

(57) ABSTRACT

A semiconductor device design support apparatus includes an input unit which inputs layout information, LSI design information, switching information, a primitive library, an electrical current waveform computation unit which obtains an electrical current waveform in instance units, an electrical current dispersion value computation unit which obtains electrical current dispersion values of each segment, a segment dividing unit which judges whether or not the electrical current dispersion value of a segment is not less than a permitted value and divides the segment in cases in which the electrical current dispersion value is not less than the permitted value, a macro-model creation unit which creates a macro-model for each segment; a substrate netlist extraction unit which extracts a substrate netlist, and a substrate noise analysis netlist creation unit which creates a substrate noise analysis netlist from a macro-model of each segment and the substrate netlist.

17 Claims, 9 Drawing Sheets

SEMICONDUCTOR DEVICE DESIGN SUPPORT APPARATUS AND SEMICONDUCTOR DEVICE DESIGN SUPPORT METHOD

REFERENCE TO RELATED APPLICATION

This application is based upon and claims the benefit of the priority of Japanese patent application No. 2008-124730 filed on May 12, 2008, the disclosure of which is incorporated herein in its entirety by reference thereto.

TECHNICAL FIELD

The present invention relates to a semiconductor device design support apparatus and a semiconductor device design support method, and, in particular, to a semiconductor device design support apparatus and a semiconductor device design support method that facilitate analysis of substrate noise occurring in a silicon substrate of a semiconductor device.

BACKGROUND

Patent Document 1 discloses a substrate noise analysis method having a step of consolidating independently of a substrate analysis structure, any of: a power supply current, a ground current, a current injected from a circuit element to a substrate, junction capacitance between a power supply, ground, a circuit element, and the substrate, interfacial resistance between the power supply, ground, a circuit element, and the substrate, power supply resistance, ground resistance, power supply voltage variation, and ground voltage variation.

Patent Document 2 discloses a substrate noise analysis method characterized by having a step of applying a static timing analysis (STA) algorithm to a description of a digital circuit and generating timing information related to one or more gates in the digital circuit, a step of applying an electrical current waveform generation (CWG) algorithm to the description of the digital circuit and a description of the timing information concerning one or more gates in the digital circuit and a switching operation of the digital circuit, and generating an electrical current waveform, and a step of generating a reduced model (RM) for simulation of the digital circuit, according to a model of a package related to the electrical current waveform and the digital circuit, and of generating a noise index for a substrate related to the digital circuit, by the RM simulation of the digital circuit.

Furthermore, Non-Patent Document 1 discloses a method of simulating, with high precision, substrate noise that affects performance of an analog circuit disposed in the same substrate, by creating a macro-model with primitive instance units. Here, the (primitive) instance indicates a name for uniquely distinguishing a cell specifying a logical unit within the substrate.

[Patent Document 1]
  JP Patent Kokai Publication No. JP-P2005-4245A
[Patent Document 2]
  JP Patent Kokai Publication No. JP-P2006-236340A
[Non-Patent Document 1]
  Marc van Heijningen et. al., "High-Level Simulation of Substrate Noise Generation Including Power Supply Noise Coupling", 2000 DAC, FIG. 1.

SUMMARY OF THE DISCLOSURE

The entire disclosures of Patent Documents 1 and 2 and Non-Patent Document 1 are incorporated herein by reference thereto.

The following analysis is given in the present invention.

In the method of Non-Patent Document 1, there is a problem in that, in order to create the macro-model with primitive instance units, the macro-model and a substrate netlist become very large, so that the size of a generated substrate noise analysis netlist becomes large, and analysis time becomes very long.

Furthermore, Patent Document 1 discloses a method of reducing amount of computation by consolidating current impedance for each region or block, but a separate process (step) of consolidation is required. Furthermore, if macro-modeling is performed without consolidation being properly performed and ignoring electrical current change of each instance, there is a problem in that electrical current accuracy deteriorates. A reason for this is that electrical current values are averaged, by adding electrical current waveforms, operation characteristics are erased, and an electrical current error occurs.

According to a first aspect of the present invention, there is provided a semiconductor device design support apparatus, wherein the apparatus sets an initial segment in a layout of a semiconductor device; obtains dispersion of electrical current values inside the segment from an electrical current waveform of an instance included in the initial segment; repeats dividing of the segment and computing of a dispersion value of the electrical current until the dispersion of the electrical current values becomes less than a prescribed value; creates a macro-model for the divided segments at a stage at which dispersion of electrical current of all segments is less than the prescribed value; and creates a substrate noise analysis netlist from the macro-model and a substrate netlist.

According to a second aspect of the present invention, there is provided a semiconductor device design support method executed on a computer, the method comprising: the computer receiving input of design information of a semiconductor device and obtaining an electrical current waveform for each instance; the computer repeating computation of an electrical current dispersion value based on the electrical current waveform for each instance, and division of the segments, until electrical current dispersion values of all segments set in the semiconductor device become less than a prescribed value; the computer creating a macro-model for all of the segments; and the computer creating a substrate noise analysis netlist from the macro-model and a substrate netlist.

The meritorious effects of the present invention are summarized as follows.

According to the present invention, it is possible to ensure desired noise analysis accuracy, and to obtain a substrate noise analysis netlist whose size is curtailed. A reason for this is that a configuration is adopted in which each instance is grouped as a segment and the number of nodes is reduced, and in addition, segment size is determined based on a dispersion value of the electrical current.

BRIEF DESCRIPTIONS OF THE DRAWINGS

PREFERRED MODES OF THE INVENTION

Outline

In a semiconductor device design support apparatus according to a preferred mode, size is determined, with instances being grouped based on an electrical current dispersion value. An electrical current dispersion value computation unit (103 in FIG. 1) of the semiconductor device design support apparatus obtains the electrical current dispersion value of each segment, based on an electrical current waveform computed by an electrical current waveform computation unit (102 in FIG. 1). Next, a segment division unit (104 in FIG. 1) judges whether or not the electrical current dispersion value of a segment is greater than or equal to a permitted value (a prescribed threshold), and if greater than or equal to the permitted value, divides the segment concerned, but if less than the permitted value, does not perform segment division.

A segment in which the electrical current dispersion value is less than the permitted value satisfies electrical current accuracy in cases in which noise analysis is performed. Conversely, for a segment in which the electrical current accuracy cannot be satisfied, segment division is performed. From the above measurers, by determining the size of the segment in which the electrical current accuracy is satisfied and creating a macro-model for each segment, it is possible to curtail the number of nodes (the size of the substrate noise analysis netlist) to a minimum.

Furthermore, if the size of the substrate noise analysis netlist that is generated is small, it is possible to also reduce time taken for noise analysis.

First Exemplary Embodiment

Figure 1:
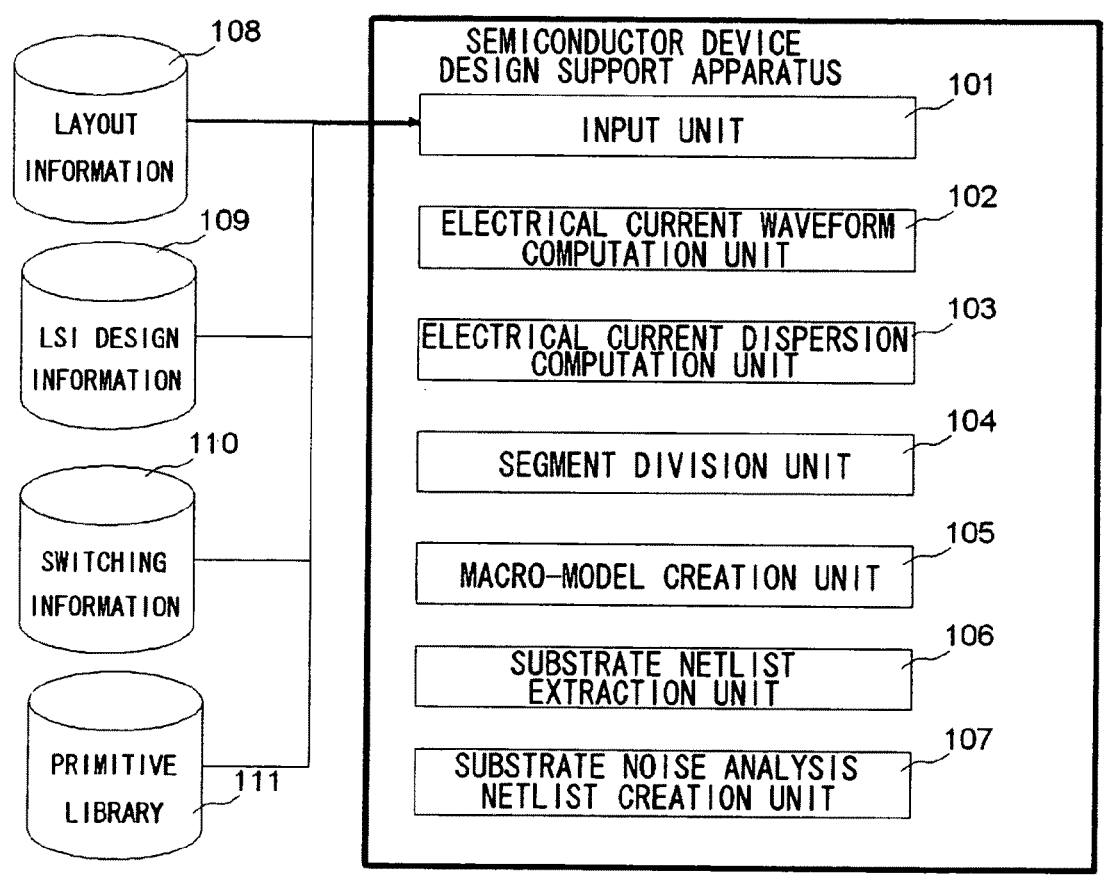
FIG. 1 is a drawing showing a configuration of a semiconductor device design support apparatus of a first exemplary embodiment of the present invention.

Next, a detailed description is given of a first exemplary embodiment making reference to the drawings. FIG. 1 is a drawing showing a configuration of a semiconductor device design support apparatus of the first exemplary embodiment.

Referring to FIG. 1, the semiconductor device design support apparatus is configured by including: an input unit 101 which inputs layout information 108, LSI design information 109, switching information 110, a primitive library 111, and the like; an electrical current waveform computation unit 102 which obtains an electrical current waveform in instance units; an electrical current dispersion value computation unit 103 which obtains an electrical current dispersion value of each segment; a segment division unit 104 which judges whether or not the electrical current dispersion value of a segment is greater than or equal to a permitted value and divides the segment in cases in which the electrical current dispersion value is greater than or equal to the permitted value; a macro-model creation unit 105 which creates a macro-model for each segment; a substrate netlist extraction unit 106 which extracts a substrate netlist; and a substrate noise analysis netlist creation unit 107 which creates a substrate noise analysis netlist from a macro-model of each segment and the substrate netlist.

The semiconductor device design support apparatus according to the present invention can be realized by a computer provided with a CPU, a storage device, an output device, and the like. The various parts of the semiconductor device design support apparatus, as described above, can be realized by reading a program from the storage device of the computer, to execute operations as described below, and by executing in the CPU.

Figure 2:
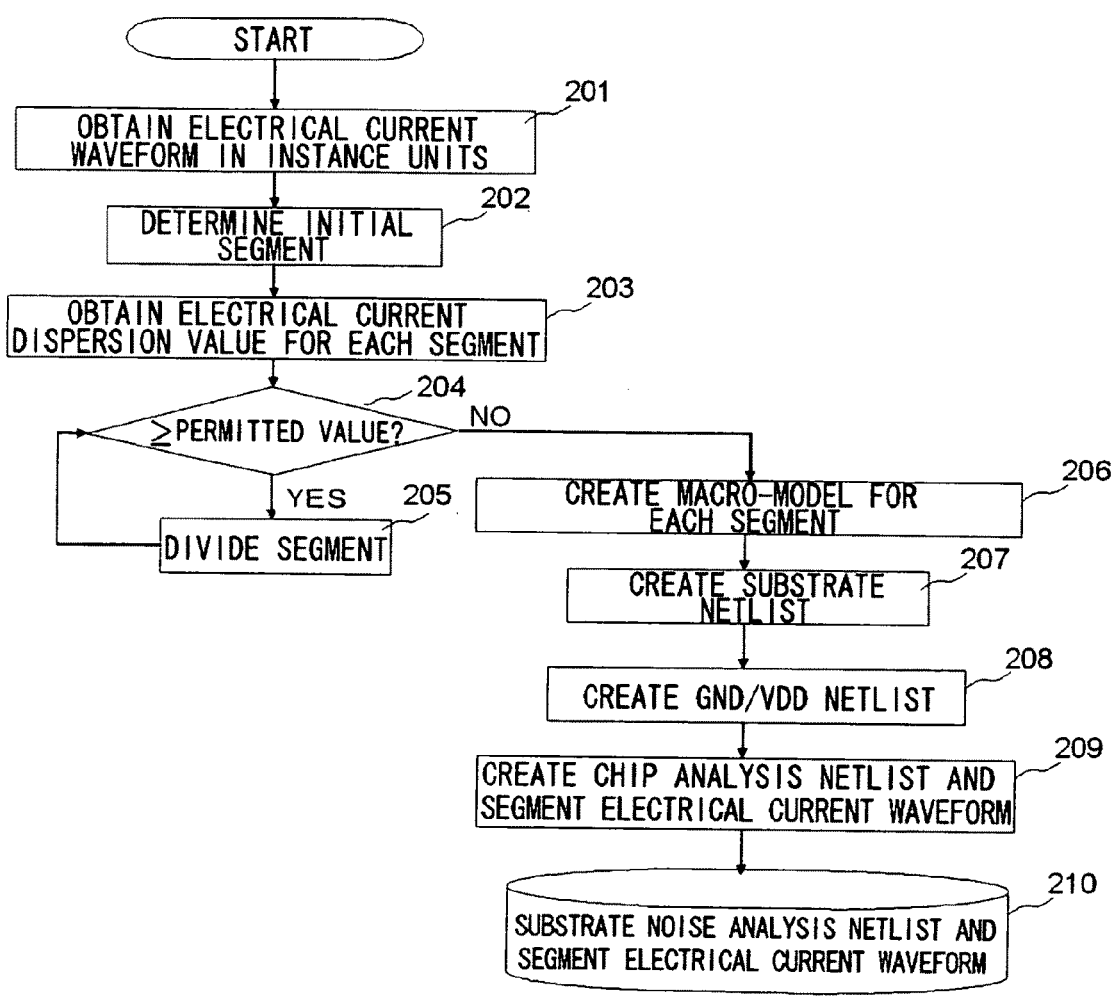
FIG. 2 is a drawing showing operation flow of the semiconductor device design support apparatus of the first exemplary embodiment of the present invention.

FIG. 2 is a drawing showing operation flow for the above-mentioned semiconductor device design support apparatus. Referring to FIG. 2, first, the electrical current waveform computation unit 102 obtains an electrical current waveform of each instance from the primitive library 111 and the switching information 110 (step 201). Computation of the electrical current waveform of each instance is not particularly limited, and, for example, it is possible to use a method described in Non-Patent Document 1, the entire disclosure thereof is incorporated herein by reference thereto.

Next, the segment division unit 104 determines an initial segment, based on the LSI design information 109 (step 202).

Next, the electrical current dispersion computation unit 103 obtains an electrical current dispersion value of the initial segment (step 203).

Next, the segment division unit 104 judges whether or not the electrical current dispersion value of the segment is greater than or equal to the permitted value (step 204).

As a result of the judgment, in cases in which the electrical current dispersion value of each segment is greater than or equal to the permitted value, the segment division unit 104 divides the segment concerned (step 205).

On the other hand, in cases in which the electrical current dispersion value of all segments is less than the permitted value, the macro-model creation unit 105 creates a macro-model for each segment (step 206).

Next, the substrate netlist extraction unit 106 extracts the substrate netlist based on the layout information 108 (step 207).

Next, the substrate noise analysis netlist creation unit 107 creates a GND/VDD netlist, from the macro-model of each segment and the substrate netlist (step 208).

Finally, the substrate noise analysis netlist creation unit 107 creates and outputs the substrate noise analysis netlist, from the macro-model of each segment and the substrate netlist (step 209).

As described above, according to the present exemplary embodiment, since segment division is performed based on the electrical current dispersion value, in steps 204 to 205, it is possible to curtail the size of the substrate noise analysis netlist, and also to ensure electrical current accuracy according to the permitted value.

EXAMPLE 1

Next, the first exemplary embodiment of the present invention described above is described as an example applied to substrate noise analysis of an SOC (System On Chip) device.

Below, in the present example, consideration is given to substrate noise analysis of a semiconductor device that is a SOC device and a multi power supply circuit.

Referring to FIG. 1 and FIG. 2 once again, operation of the semiconductor device design support apparatus of the present example is described in detail for each step.

By setting parameters such as the permitted value in comparison to the electrical current dispersion value, and inputting the layout information 108, the LSI design information 109, the switching information 110, and the primitive library 111, to the input unit 101, a sequence of processing as in FIG. 2 is started.

Figure 3:
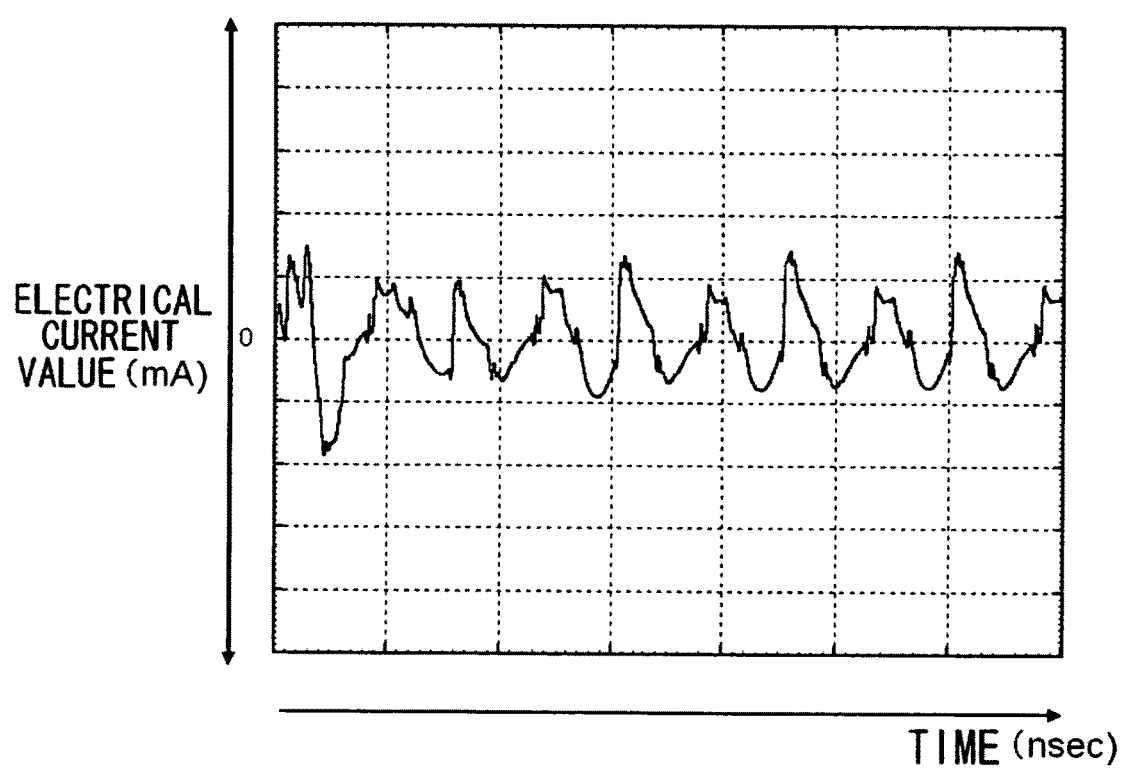
FIG. 3 is an example of an electrical current waveform of an instance.

In step 201, the electrical current waveform computation unit 102 obtains an electrical current waveform for GND and VDD terminals for each instance from the primitive library 111 and the switching information 110. FIG. 3 is an example of an electrical current waveform of an instance computed in the present step.

Figure 4:
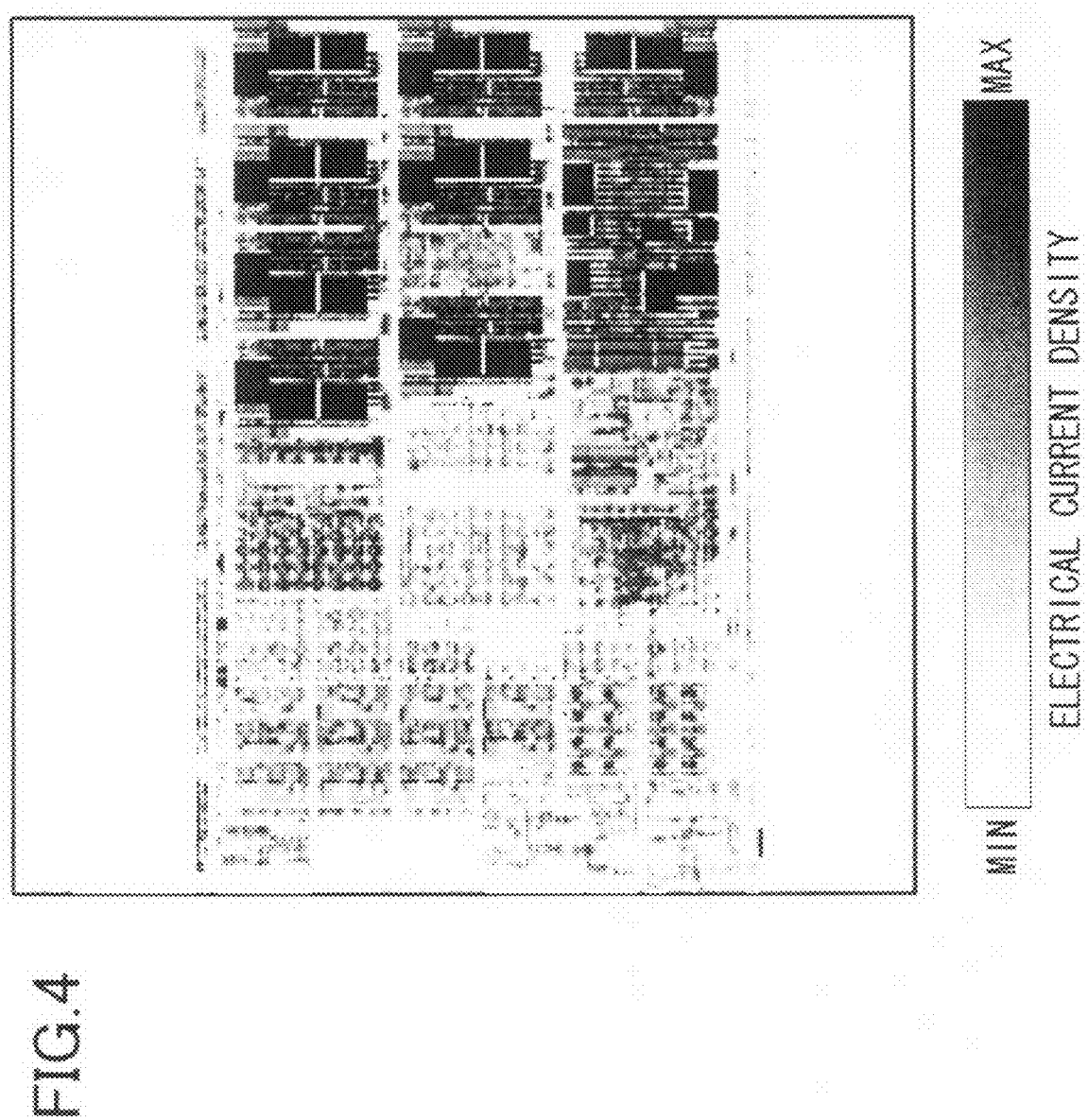
FIG. 4 is a drawing showing electrical current distribution in a semiconductor device that is to be analyzed.

FIG. 4 is a drawing showing an example of electrical current distribution in the semiconductor device that is to be analyzed. As represented by shading in FIG. 4, it is possible to confirm that there are differences in the electrical current value of various portions of the semiconductor device.

In step 202, the segment division unit 104 determines an initial segment, based on the LSI design information 109. In the present example, the whole layout of the semiconductor device is made the initial segment. The initial segment can be set arbitrarily based on the LSI design information 109, and, for example, the whole layout divided into 2 divisions, 4 divisions, or 16 divisions, or any arbitrary number of divisions can be made initial segments.

In step 203, the electrical current dispersion computation unit 103 obtains electrical current dispersion of each segment. As is understood from FIG. 3 which represents the electrical current waveform, since the electrical current waveform of GND and VDD varies with time, a dispersion value at each time period is obtained, and the maximum value thereof is taken as the electrical current dispersion value of a segment concerned. Furthermore, it is also possible to take, not the maximum value, but an average value of the electrical current dispersion values at each time period, as the electrical current dispersion value of the segment concerned.

In step 204, a judgment is made as to whether or not the electrical current dispersion value of a segment is greater than or equal to the permitted value.

Figure 5:
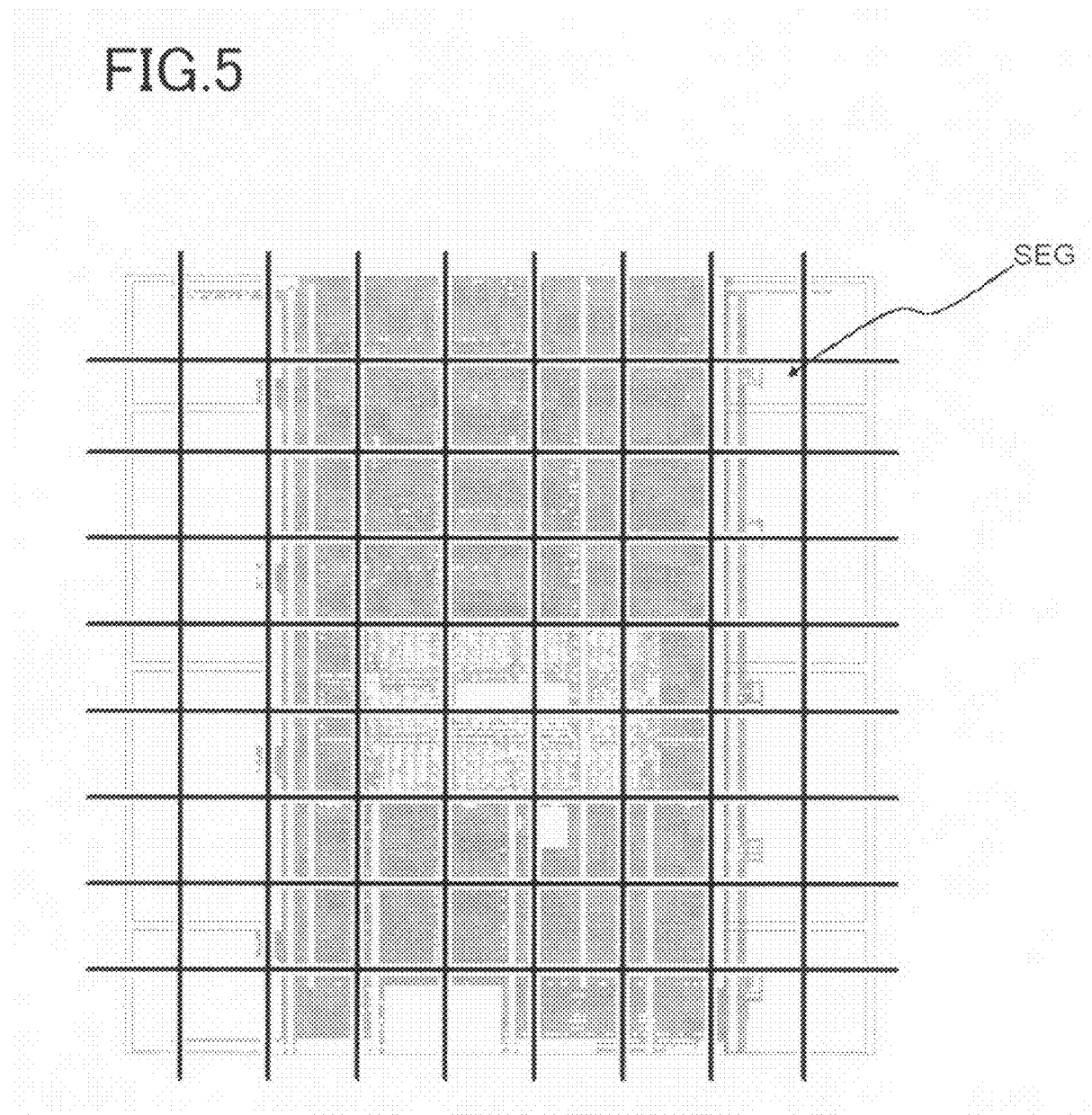
FIG. 5 is a drawing for illustrating segment division.

If the electrical current dispersion value of the segment is greater than or equal to the permitted value, the segment division unit 104 divides the segment. At this time, the segment division unit 104 divides the segment in which the electrical current dispersion value is greater than or equal to the permitted value. An example of a segment (SEG) when dividing is complete is shown in FIG. 5.

Figure 6:
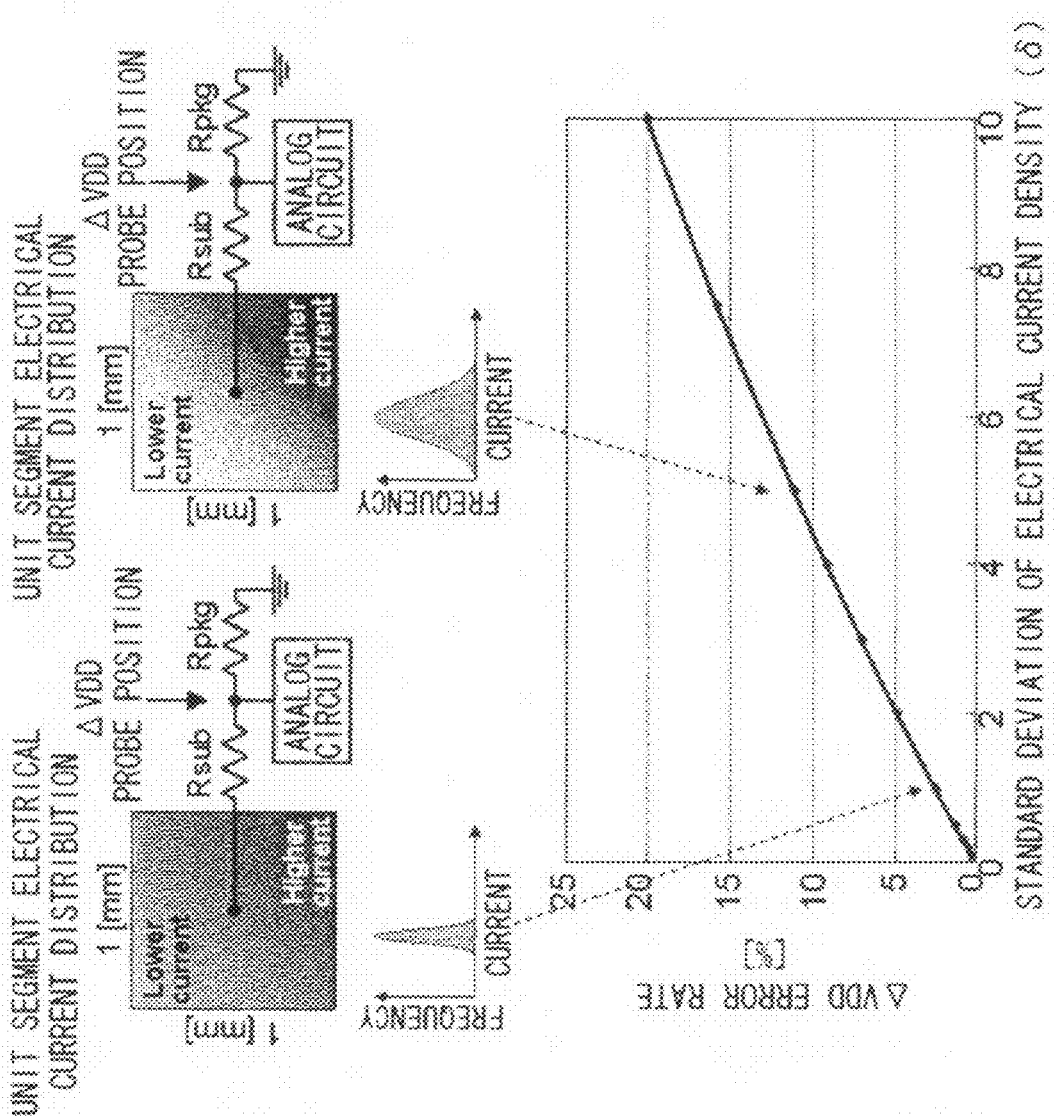
FIG. 6 is a drawing for illustrating a relationship between electrical current dispersion values and probe voltage error.

Here, a description is given concerning the electrical current dispersion value. Consideration is given to obtaining noise amount propagated via the substrate from all instances in one segment, that is, voltage (Δ VDD) at a propagation destination node. An "analog circuit" of FIG. 6 represents the propagation destination node. Since for normal instances, operation of each differs, the electrical current of each instance also differs.

Next, consideration is given to degenerating a segment as one node. When instances within a segment all have the same operation, the electrical current waveform is the same in each instance. If this condition is considered in terms of dispersion, the dispersion is 0. At this time, even if the segment is degenerated as one node, the voltage of a propagation destination node is the same as cases in which there is no degeneration, that is, an error of 0 (refer to the origin of the graph in the lower part of FIG. 6). Next, consideration is given to cases in which operation differs, that is, there is a difference in electrical current values. As the dispersion value of an instance within one segment becomes large, error (Δ VDD error rate) increases (refer to the graph in the lower part of FIG. 6).

With regard to the abovementioned error (Δ VDD error rate), a value permitted according to the type of the propagation destination node, the permitted value, is decided. That is, if a block with high noise sensitivity used for each chip is determined, the permitted value is also decided. That is, a limit of the electrical current dispersion value is also decided.

Figure 7:
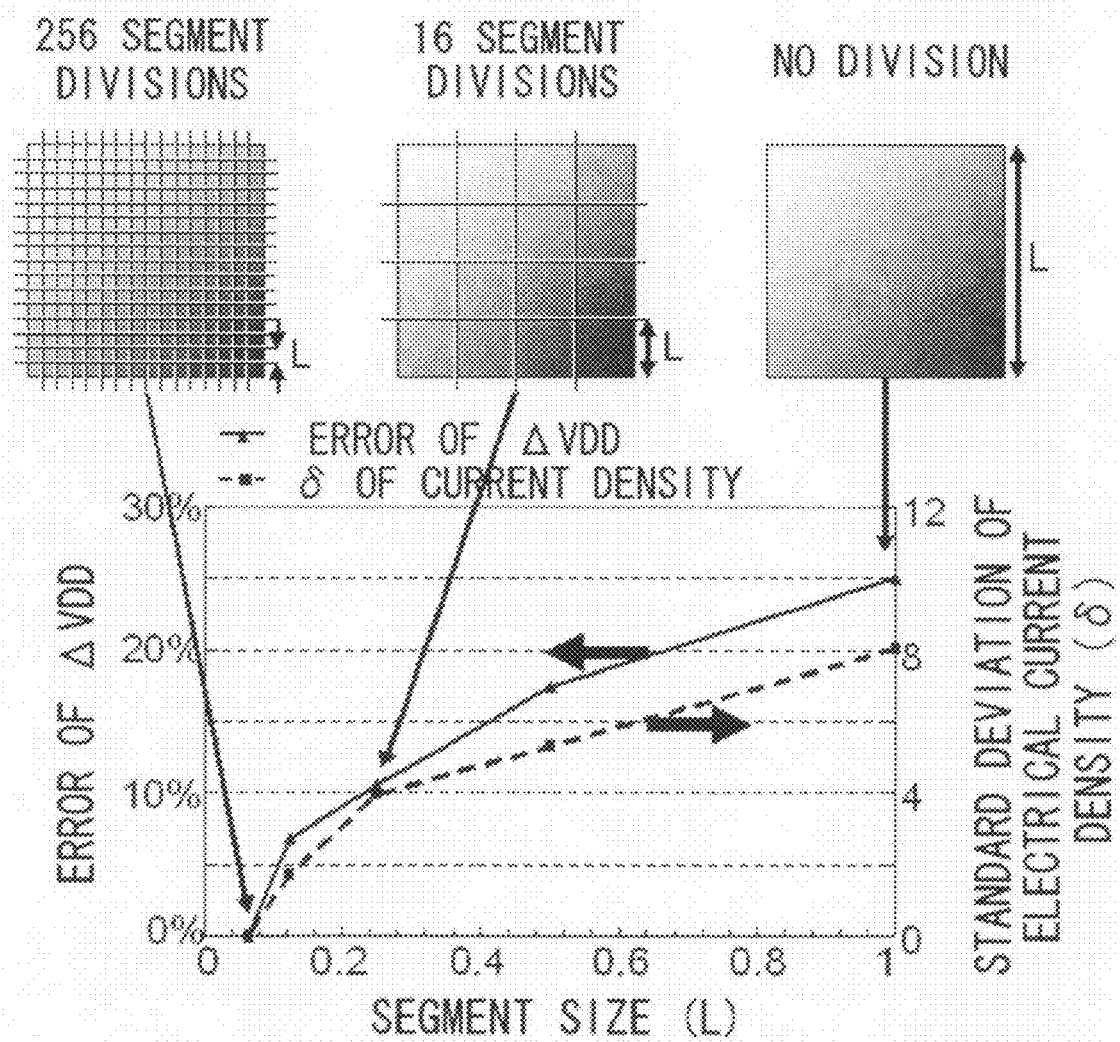
FIG. 7 is a drawing for illustrating a relationship between segment size (number of divisions) and probe voltage error.

As shown in FIG. 7, as the number of divided segments increases, the electrical current dispersion value (refer to broken line in lower graph (standard deviation of electrical current density)) of the segment is smaller. As the electrical current dispersion value becomes smaller, the error (refer to full line in the lower graph (Δ VDD error rate)) becomes smaller. Therefore, it is possible to create a substrate noise analysis netlist that satisfies requirements of noise analysis by dividing the segments until the permitted value is reached, On the other hand, as the number of segments increases, the number of nodes increases, and thus the netlist generated becomes large. If the netlist is large, time is required for analysis. Therefore, it is important to reduce the number of segments, and to curtail the size of the netlist generated.

Consequently, by setting the permitted value, and dividing the segments with the permitted value as a reference, it is possible to minimize the number of segments, and to generate the substrate noise analysis netlist, which satisfies required performance.

Figure 8:
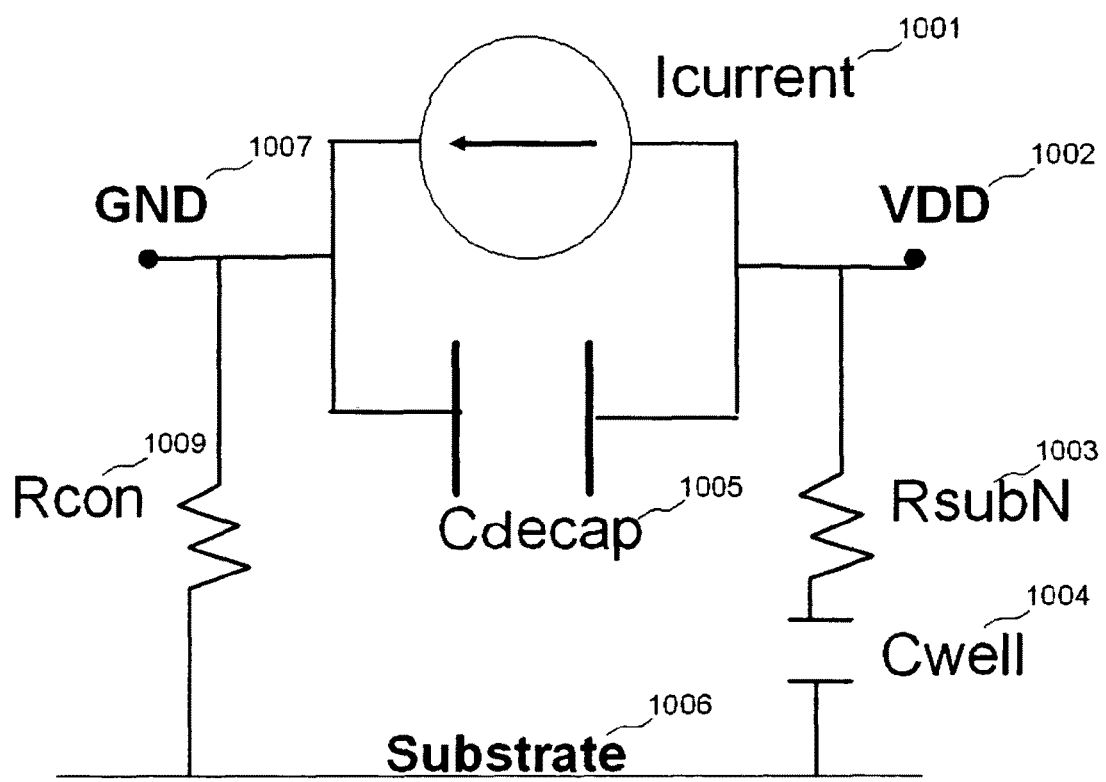
FIG. 8 is a drawing showing one example of a macro-model.

In step 206, the macro-model creation unit 105 creates a macro-model for the divided segment or segments, typically for each of segments. FIG. 8 is a drawing showing one example of a macro-model.

In FIG. 8, Icurrent 1001 represents the electrical current waveform of the segment, as a total of electrical current waveforms of instances within the segment. Cdecap 1005 represents decoupling capacitance of the segment, as a total of decoupling capacitances within the segment. In this way, the macro-model creation unit 105 in the present example functions as a decoupling capacitance computation unit, and also creates a model of decoupling capacitance. GND 1007 and VDD 1002 represent a power supply of the segments and a GND terminal, respectively.

In step 207, the substrate netlist extraction unit 106 extracts the substrate netlist.

In step 208, the substrate noise analysis netlist creation unit creates a GND/VDD netlist from the macro-model of each segment and the substrate netlist.

In step 209, the substrate noise analysis netlist creation unit creates the substrate noise analysis netlist from the macro-model of each segment, the model of decoupling capacitance, the substrate netlist, and the GND/VDD netlist, and performs output.

Figure 9:
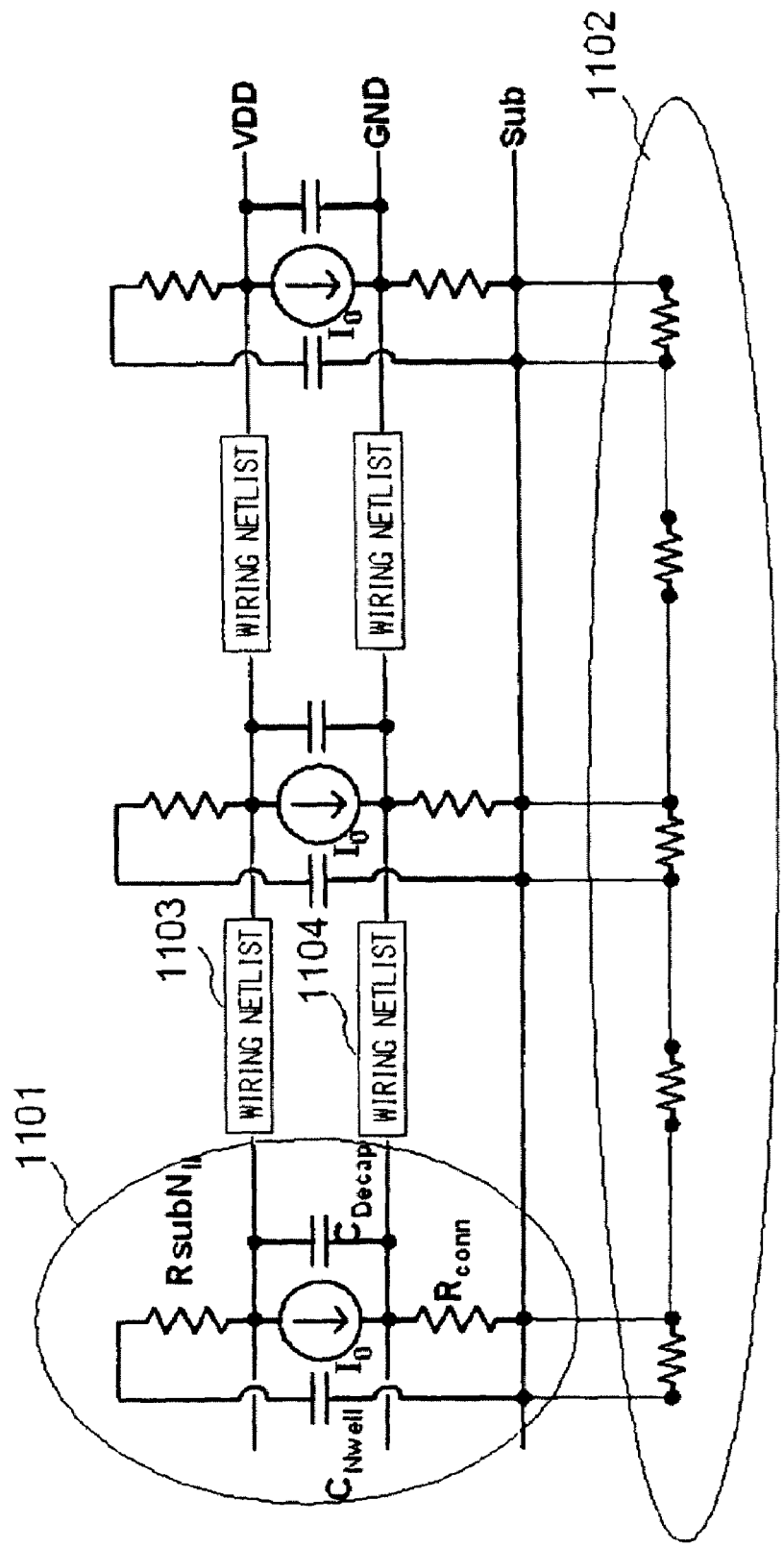
FIG. 9 is a drawing showing one example of a substrate noise analysis netlist.

FIG. 9 is a drawing showing one example of the netlist outputted in the abovementioned steps 208 and 209. Referring to FIG. 9, the GND terminal and the VDD terminal of each segment 1101 are respectively connected to a VDD netlist 1103 and a GND netlist 1104. The VDD netlist 1103 and the GND netlist 1104 are netlists representing a capacitor, a resistor and an inductor of GND and VDD wiring, respectively, between the segments. Furthermore, a substrate terminal is connected by a substrate netlist 1102.

Using the substrate noise analysis netlist generated in this way, it is possible to perform the substrate noise analysis. For example, TRAN analysis can be performed using the substrate noise analysis netlist, a waveform that attains a macro having a noise constraint can be obtained, and it is possible to judge whether or not the noise constraint is satisfied using the obtained waveform.

A preferred exemplary embodiment of the present invention has been description above, but the present invention is not limited to the abovementioned exemplary embodiment, and further modifications, substitutions, and alterations can be added, within a scope that does not depart from fundamental technological concepts of the present invention. For example, it is possible to add to the configuration described by the abovementioned exemplary embodiment and example, a package-PWB netlist creation unit that creates a netlist between a package and a PWB (Printed Wiring Board) from design information of semiconductor device that has been inputted. In this way, it is possible to perform substrate noise analysis that gives consideration to the package-PWB netlist.

The present invention is useful as technology for analysis of effects of substrate noise generated in a silicon substrate of a semiconductor device.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device design support apparatus, comprising:
    a plurality of units that sets an initial segment in a layout of a semiconductor device, determining a $\Delta$VDD error rate,
    obtains dispersion of electrical current values, which is with respect to said $\Delta$VDD error rate, inside said segment from an electrical current waveform of an instance included in said initial segment,
    wherein said segment is a group in which instances are grouped,
    repeats dividing of said segment without changing width of lines that define said segment and computing of a dispersion value of said electrical current which is with respect to said $\Delta$VDD error rate, the dispersion value being desired to be less than a prescribed value which is decided based on said $\Delta$VDD error rate, if dispersion of said electrical current values is equal to or greater than the prescribed value,
    creates a macro-model for said divided segments at a stage at which dispersion of electrical current of all segments is less than said prescribed value, and
    creates a substrate noise analysis netlist from said macro-model and a substrate netlist.

2. The semiconductor device design support apparatus according to claim 1, wherein the plurality of units comprise:
    an electrical current waveform computation unit that obtains an electrical current waveform for each instance, from design information of said semiconductor device, which has been inputted;
    an electrical current dispersion value computation unit that obtains electrical current dispersion values for each of said segments, based on said electrical current waveform for each instance;
    a segment division unit that repeats confirmation of an electrical current dispersion value which is desired to be less than the prescribe value for each of said segments and division of said segment(s), if said electrical current dispersion values of all segments is equal to or greater than the prescribed value;
    a macro-model creation unit that creates a macro-model for all of said segments, in which said electrical current dispersion value is less than said prescribed value; and
    a substrate noise analysis netlist creation unit that creates a substrate noise analysis netlist from said macro-model and said substrate netlist.

3. The semiconductor device design support apparatus according to claim 2, wherein said electrical current dispersion value computation unit takes a maximum value of electrical current dispersion values within a prescribed time as an electrical current dispersion value of a segment concerned.

4. The semiconductor device design support apparatus according to claim 2, wherein said electrical current dispersion value computation unit takes an average value of electrical current dispersion values within a prescribed time as an electrical current dispersion value of a segment concerned.

5. The semiconductor device design support apparatus according to claim 2, wherein said segment division unit divides only a segment in which said electrical current dispersion value is not less than the prescribed value.

6. The semiconductor device design support apparatus according to claim 2, wherein said substrate noise analysis netlist creation unit creates a netlist of at least GND (ground) and VDD (power supply voltage), is connected to a macro-model for each of said segments and said substrate netlist, and creates a substrate noise analysis netlist.

7. The semiconductor device design support apparatus according to claim 2, further comprising:
    a decoupling capacitance computation unit that obtains decoupling capacitance of a segment from design information of said semiconductor device, which has been inputted,
    wherein a macro-model including said decoupling capacitance is used to create a substrate noise analysis netlist.

8. The semiconductor device design support apparatus according to claim 2, further comprising:
    a package-PWB (printed wiring board) netlist creation unit that creates a package-PWB netlist from design information of said semiconductor, device, which has been inputted, wherein a substrate noise analysis netlist that includes said package-PWB netlist is created.

9. A semiconductor device design support method executed on a computer, comprising:
    said computer receiving input of design information of a semiconductor device, setting an initial segment, wherein said segment is a group in which instances are grouped, determining a $\Delta$VDD error rate, and obtaining an electrical current waveform for each instance;
    said computer repeating computation of an electrical current dispersion value which is with respect to said $\Delta$VDD error rate, the dispersion value being desired to be less than a prescribed value based on an electrical current waveform for each of said instances, the prescribed value being decided based on said $\Delta$VDD error rate, and division of said segment without changing width of lines that define said segment, if electrical current dispersion values of all segments set in said semiconductor device are equal to or greater than the prescribed value;
    said computer creating a macro-model for all of said segments; and
    said computer creating a substrate noise analysis netlist from said macro-model and a substrate netlist.

10. A semiconductor device design support apparatus, comprising:
    means for setting an initial segment in a layout of a semiconductor device and determining a $\Delta$VDD error rate;
    means for obtaining dispersion of electrical current values which is with respect to the $\Delta$VDD error rate, inside said segment from an electrical current waveform of an instance included in said initial segment,
    wherein said segment is a group in which instances are grouped;
    means for repeat dividing of said segment without changing width of lines that define said segment and computing of a dispersion value of said electrical current which is with respect to said $\Delta$VDD error rate, the dispersion value being desired to be less than a prescribed value which is decided based on said $\Delta$VDD error rate, if dispersion of said electrical current values is equal to or greater than the prescribed value;

means for creating a macro-model for said divided segments at a stage at which dispersion of electrical current of all segments is less than said prescribed value; and means for creating a substrate noise analysis netlist from said macro-model and a substrate netlist.

11. The semiconductor device design support apparatus according to claim 10, comprising:

means for obtaining an electrical current waveform for each instance, from design information of said semiconductor device, which has been inputted;

means for obtaining electrical current dispersion values for each of said segments, based on said electrical current waveform for each instance;

means for repeating confirmation of an electrical current dispersion value for each of said segments and division of said segment(s) by segment division until said electrical current dispersion values of all segments become less than a prescribed value;

means for creating a macro-model for all of said segments, in which said electrical current dispersion value is less than said prescribed value; and means for creating a substrate noise analysis netlist from said macro-model and said substrate netlist, termed as substrate noise analysis netlist creation means.

12. The semiconductor device design support apparatus according to claim 11, wherein said means for obtaining the electrical current dispersion values takes a maximum value of electrical current dispersion values within a prescribed time as an electrical current dispersion value of a segment concerned.

13. The semiconductor device design support apparatus according to claim 11, wherein said means for obtaining the electrical current dispersion values takes an average value of electrical current dispersion values within a prescribed time as an electrical current dispersion value of a segment concerned.

14. The semiconductor device design support apparatus according to claim 11, wherein said segment division means divides only a segment in which said electrical current dispersion value is not less than a prescribed value.

15. The semiconductor device design support apparatus according to claim 11, wherein said substrate noise analysis netlist creation means creates a netlist of at least GND and VDD, is connected to a macro-model for each of said segments and said substrate netlist, and creates a substrate noise analysis netlist.

16. The semiconductor device design support apparatus according to claim 11, further comprising:

decoupling capacitance computation means for obtaining decoupling capacitance of a segment from design information of said semiconductor device, which has been inputted, wherein a macro-model including said decoupling capacitance is used to create a substrate noise analysis netlist.

17. The semiconductor device design support apparatus according to claim 11, further comprising:

package-PWB netlist creation means for creating a package-PWB netlist from design information of said semiconductor, device, which has been inputted, wherein a substrate noise analysis netlist that includes said package-PWB netlist is created.

* * * * *